Feb. 10, 1970 H. L. THEILGAARD 3,494,029

METHOD OF FORMING ELECTRICAL CONNECTIONS
THROUGH CIRCUIT BOARDS
Filed March 28, 1968

INVENTOR
HARVEY L. THIELGAARD

BY Michael O. O'Neil
ATTORNEY

United States Patent Office 3,494,029

Patented Feb. 10, 1970

3,494,029

METHOD OF FORMING ELECTRICAL CONNECTIONS THROUGH CIRCUIT BOARDS

Harvey L. Theilgaard, Mount Prospect, Ill., assignor to Teletype Corporation, Skokie, Ill., a corporation of Delaware Filed Mar. 28, 1968, Ser. No. 716,790
Int. Cl. H05k *3/30;* H01r *43/00*
U.S. Cl. 29—628 4 Claims

ABSTRACT OF THE DISCLOSURE

The method of forming electrical connections through printed circuit boards including the steps of forming a cutting edge on the end of a length of conductive wire, employing the wire as a cutting tool to remove a portion of the circuit board having the cross-sectional configuration of the wire and soldering the ends of the wire to conductive areas on the circuit board.

BACKGROUND OF THE INVENTION

Throughout the development of printed circuit boards there has been a constant search for methods of forming electrical connections through such boards to interconnect conductive areas on opposite sides thereof. Although various methods of forming such connections, including rivets and eyelets, through-hole plating and various pins and wires positioned in preformed holes have been tried in the past, there has heretofore been no method of forming electrical connections through printed circuit boards that is both reliable in operation and economically feasible for large scale industrial adaptation.

SUMMARY OF THE INVENTION

In the preferred embodiment a low cost method of forming reliable connections through circuit boards is characterized by the step of employing the member that is to interconnect the two sides of the circuit board as a cutting tool to blank a hole for itself through the board.

DESCRIPTION OF THE DRAWING

A more complete understanding of the invention may be had by referring to the following detailed description when taken in conjunction with the drawing wherein.

DETAILED DESCRIPTION

Figure 1:
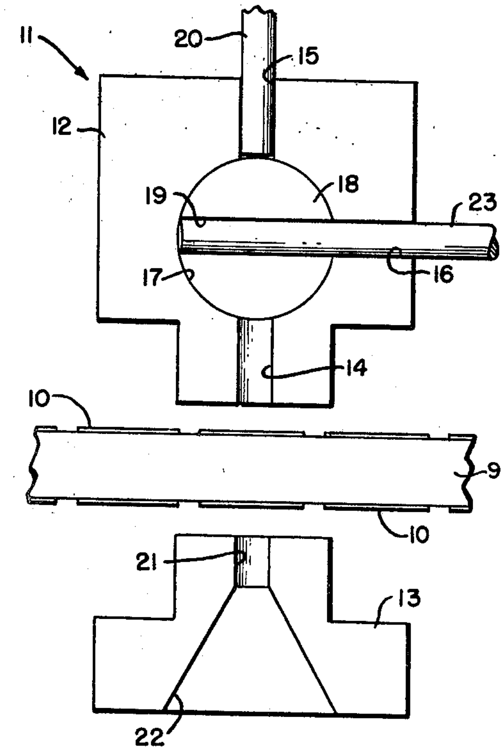
FIGURE 1 is a schematic illustration of a device useful in practicing the method of the present invention in which the component parts of the device are shown in the position they occupy at a first stage in the operation of the device.

Referring now to the drawing, wherein like reference numerals designate like parts throughout the several views, and referring particularly to FIGURE 1 thereof, there is shown a printed circuit board 9 of the type having conductive areas 10 positioned opposite each other on each of its sides and a conductive area interconnecting mechanism 11 including an upper guide member 12 and a lower guide member or die 13. The upper guide member 12 has an upper guide tube 14, a ram guide tube 15 and a wire guide tube 16 formed through it, with the upper guide tube 14 and the ram guide tube 15 extending coaxially of each other and with the wire guide tube 16 positioned in the plane of the upper guide tube 14 and extending perpendicularly with respect thereto.

The upper guide member 12 also has a cylindrical rotary die receiving cavity 17 formed in it. A rotary die 18 having a die guide tube 19 extending through it is positioned in the cavity 17 for rotary movement to move the die guide tube 19 from a position wherein it extends coaxially of the wire guide tube 16 to a position wherein it extends coaxially of the ram guide tube 15 and the upper guide tube 14. A ram 20 is positioned in the ram guide tube 15 for movement through the die guides 19 into the upper guide tube 14 when the die guide tube 19 is in alignment with the ram guide tube 15. The die 13 has a lower guide member 21 formed through it which terminates in a conically shaped discharge tube 22. The lower guide tube 21 extends coaxially of the upper guide tube 14.

In use, a wire 23 formed from a mechanically hard, electrically conductive substance such a beryllium copper is fed through the wire guide tube 16 and a predetermined distance into the die guide tube 19 from a wire feeding member (not shown). A printed circuit board 9 is positioned between the upper guide member 12 and the lower guide member 13 and the guide members 12 and 13 are clamped into engagement with the opposite sides of the printed circuit board 9 with the upper guide tube 14 and the lower guide tube 21 positioned in alignment with conductive areas 10 on the printed circuit board 9 to be interconnected. The rotary die 18 is then rotated to bring the die guide tube 19 into alignment with the upper die guide tube 14. This action cuts a predetermined length of wire 24, which may be as long as the length of the die guide tube 19, from the wire 23 and, due to the cylindrical shape of the rotary die 18 and the cavity 17, simultaneously forms a convex, rounded ram engaging end 25 on one end of the length of wire 24 and forms a concave blanking or cutting end 26 on the end of the wire 23. Thus, when the length of a wire 24 is positioned in the position shown in FIGURE 2 it has a convex end 25 formed by the cutting operation that separated it from the wire 23 and has a concave blanking end 26 formed by the next preceding operation of the rotary die 18.

Figure 2:
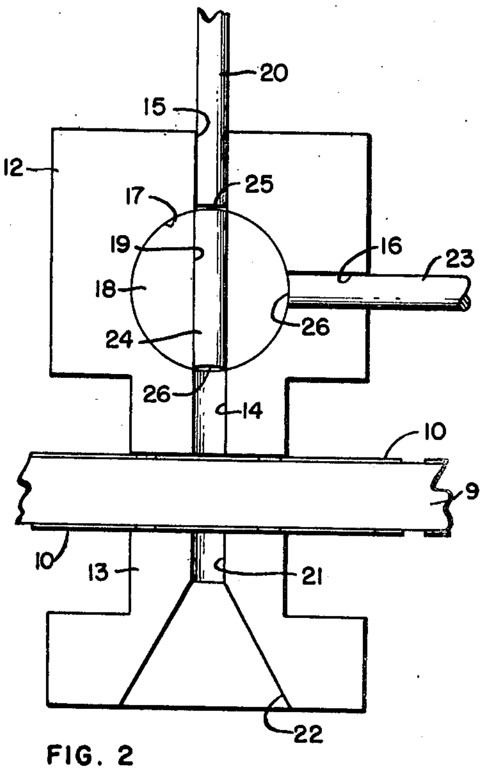
FIGURE 2 is an illustration similar to FIGURE 1 showing the component parts of the device in the position they occupy at a later stage in the operation of the device.
Figure 3:
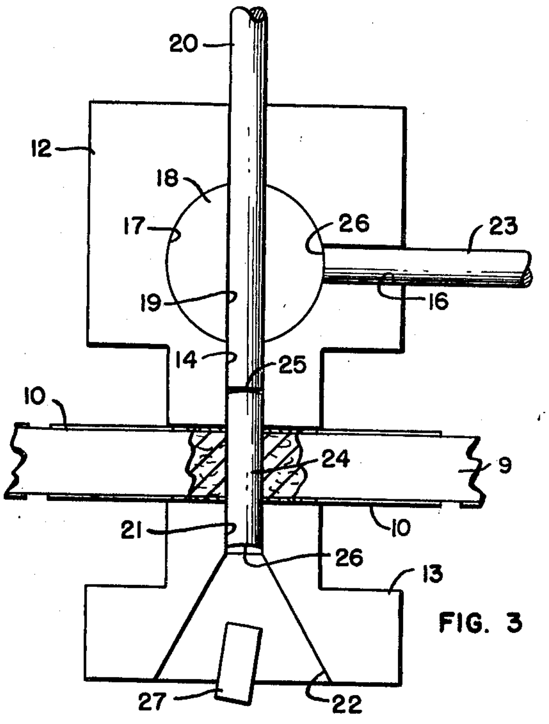
FIGURE 3 is an illustration similar to FIGURE 2 showing the parts in the position they occupy at a still later stage of the operation of the device.

When the length of wire 24 is positioned in the position shown in FIGURE 2 the ram 20 is driven downwardly to drive the length of wire 24 through the printed circuit board 9. This operation forms a hole through the printed circuit board 9 for the length of wire 24 by removing a section 27 having the same cross-sectional configuration as the length of wire 24 from the printed circuit board 9, an operation known in the art as blanking. This blanking operation is made possible by forming the die guide tube 19 and the upper guide tube 14 to exactly the same cross-sectional configuration as the cross-sectional configuration of the wire 24 so that the length of wire 24 does not buckle as the ram 20 drives it through the printed circuit board 9 and by forming the lower guide tube 21 to the same cross-sectional configuration as the length of wire 24 so that the upper edges of the lower guide tube 21 cooperate with the blanking end 26 on the length of wire 24 to cut the section 27 cut of the printed circuit board 9 by a shearing action.

Figure 4:
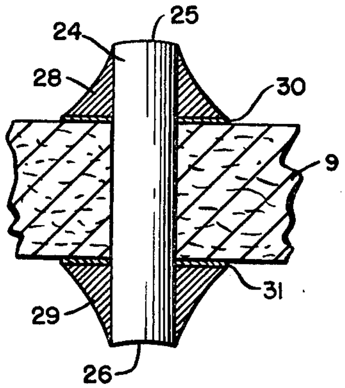
FIGURE 4 is an enlarged sectional view showing an interconnection made in accordance with the present invention.

After the length of wire 24 is inserted through the printed circuit board 9 by forming a hole for itself through the board 9 the upper and lower guide members 12 and 13, the ram 20 and the rotary die 18 are returned to the positions they occupy in FIGURE 1. This action unclamps the printed circuit board 9 from the upper and lower guide members 12 and 13 thereby freeing the printed circuit board 9 having the length of wire 24 inserted through it from the interconnecting mechanism 11. The printed circuit board 9 is then moved to a soldering station (not shown) wherein cones of solder 28 and 29 are formed around the ends of the length of wire 24 that project from the circuit board 9 thereby interconnecting the ends of the length of the wire 24 and conductive areas 30 and 31 positioned on opposite sides of the printed circuit board 9 in the manner shown in FIGURE 4. The cone shaped configuration of the solder is particularly useful for interconnecting the length of wire 24 and the conductive areas 30 and 31 because it provides a sufficient mass of solder to assure a good electrical interconnection therebetween even after relative expansions and contractions of the length of wire 24 and the body of the printed circuit board 9 caused by repeated heatings and coolings. The cone shaped configurations can be obtained either by passing the printed circuit board 9 directly through a solder fountain or by passing a printed circuit board 9 having bulbs of solder formed on the ends of a length of wire 24 through a bath of hot oil to form the cone shaped configurations by a solder reflow or remelting process.

Although a single embodiment of the method of the present invention has been described herein and although that method has been described in conjunction with a particular device useful in practicing the method, it will be understood that the steps of the method can be rearranged and altered and that additional steps can be added or substituted and that other devices can be used in practicing the method without departing from the spirit of the invention.

What is claimed is:

1. A method of forming electrical connections including the steps of:

positioning an imperforate portion of a circuit member having conductive surfaces formed on opposite ones of its sides between a pair of guide members each having at least one guide cylinder formed in it;

clamping the circuit member between the guide members with the guide members in engagement with the conductive surfaces and with the guide cylinders in axial alignment with each other and with the imperforate portion of the circuit member;

forming a cylindrical concave blanking end surface on an end of a length of electrically conductive material, said cylindrical surface having an axis substantially transverse of the longitudinal axis of said length;

driving the length of conductive material concave end first through the guide cylinder in one of the guide members and through the imperforate portion of the circuit member into the guide cylinder in the other of the guide members for blanking a portion of the circuit member out of the circuit member;

unclamping the guide members from the circuit member with the length of conductive material extending through the circuit member; and conductively bonding the length of conductive material to both conductive surfaces of the circuit.

2. The method according to claim 1 wherein the step of forming a blanking end surface includes the step of cutting the length of conductive material to a length at least equal to the distance between the conductive surfaces on the circuit member and wherein the method includes the additional step of electrically connecting the ends of the length of conductive material to the conductive surfaces.

3. A method of forming electrical connections through circuit boards including the steps of:

positioning a circuit board of the type having a body of predetermined thickness and having conductive areas formed opposite each other on both sides of the body between a pair of guide members having guide sleeves of a predetermined diameter formed through them;

clamping the guide members in engagement with the circuit board with the guide members in engagement with the conductive surfaces thereon and with the guide sleeves of the guide members extending coaxially;

cutting a substantially concave cutting edge on the end of a conductive wire of the predetermined diameter;

cutting the wire to a length of at least as long as the thickness of the body of the circuit board;

cutting a cylinder of the predetermined diameter from the circuit board using said cutting edge of the length of wire as a cutting tool by forcing the length of wire from one of the guide sleeves through the conductive areas and the body of the circuit board into the other guide sleeve;

unclamping the guide members from the circuit board with the length of wire positioned within the body of the circuit board and extending between the conductive areas thereon; and conductively bonding the length of wire to the conductive areas of the circuit board.

4. The method of forming electrical connections through circuit boards according to claim 3 further characterized in that the length of wire is cut to a length substantially longer than the thickness of the body of the circuit and in that the electrical connections between the length of wire and the conductive areas of the circuit board are made by forming cone shaped bodies of solder each of which extends from a base engaged with a conductive area of the circuit board along the length of wire and terminates in a tip at an end of the wire.

References Cited

UNITED STATES PATENTS

| | | | |
|---|---|---|---|
| 3,093,887 | 6/1963 | Prestige et al.. | |
| 3,159,906 | 12/1964 | Telfer | 29—626 |
| 3,264,524 | 8/1966 | Dahlgren et al. | |

OTHER REFERENCES

Engineering Design News, February 1963 issue, pp. 118 and 119.

JOHN F. CAMPBELL, Primary Examiner

ROBERT W. CHURCH, Assistant Examiner

U.S. Cl. X.R.

29—203, 432, 626, 629; 174—68.5; 339—17